United States Patent [19]

Shimotori et al.

[11] Patent Number: 4,551,741
[45] Date of Patent: Nov. 5, 1985

[54] DRAM WITH POLYSI BIT LINES AND ADDED JUNCTION CAPACITANCE

[75] Inventors: Kazuhiro Shimotori; Hideyuki Ozaki, both of Itami, Japan

[73] Assignee: Mitsubishi Denki Kabushiki Kaisha, Tokyo, Japan

[21] Appl. No.: 565,531

[22] Filed: Dec. 29, 1983

Related U.S. Application Data

[63] Continuation of Ser. No. 279,559, Jul. 1, 1981, abandoned.

[30] Foreign Application Priority Data

Jul. 7, 1980 [JP] Japan ................... 55-93461

[51] Int. Cl.⁴ ............... H01L 27/04; G11C 11/40
[52] U.S. Cl. ................... 357/23.6; 357/41; 357/59
[58] Field of Search ............ 357/23 C, 59, 23 S, 357/41, 51, 14

[56] References Cited

U.S. PATENT DOCUMENTS

| | | | |
|---|---|---|---|
| 3,810,125 | 5/1974 | Stein | 357/41 |
| 4,062,037 | 12/1977 | Togei et al. | 357/23 C |
| 4,163,243 | 7/1979 | Kamins | 357/41 |
| 4,240,092 | 12/1980 | Kuo | 357/91 |
| 4,240,195 | 12/1980 | Clemens et al. | 357/23 C |
| 4,262,298 | 4/1981 | Tuan et al. | 357/23 C |
| 4,329,706 | 5/1982 | Crowder et al. | 357/59 |
| 4,334,236 | 6/1982 | Hoffman et al. | 357/23 C |
| 4,392,210 | 7/1983 | Chan | 357/23 C |

FOREIGN PATENT DOCUMENTS

| | | | |
|---|---|---|---|
| 52-119085 | 10/1977 | Japan . | |
| 55-62763 | 5/1980 | Japan | 357/23 C |

OTHER PUBLICATIONS

Forlino et al., IBM Tech. Discl. Bulletin, vol. 20, No. 2, Jul. 1977, pp. 539–540.
IBM Technical Disclosure Bulletin, vol. 21, No. 9, Feb. 1979, pp. 3828–3831, Rideout.
IEEE Transactions on Electron Devices, vol. ED-26, No. 6, Jun. 1979, p. 846, Rideout.

Primary Examiner—William D. Larkins
Attorney, Agent, or Firm—Oblon, Fisher, Spivak, McClelland & Maier

[57] ABSTRACT

A semiconductor memory device having two layers of polycrystal silicon and having an insulated gate field effect transistor as a fundamental element including by using a first layer of polycrystalline silicon serving as an electrode of a capacitor and a bit line and a second layer of polycrystalline silicon serving as a gate electrode of the transistor.

3 Claims, 10 Drawing Figures

DRAM WITH POLYSI BIT LINES AND ADDED JUNCTION CAPACITANCE

This application is a continuation of application Ser. No. 279,559, filed July 1, 1981, now abandoned.

BACKGROUND OF THE INVENTION

1. Field of the Invention

The present invention relates to a semiconductor memory device having an insulated gate field effect transistor (hereinafter referring to as MISFET) as a fundamental element.

2. Description of the Prior Art

FIG. 1 is a plane view of the conventional semiconductor memory device. FIG. 2(a) is a sectional view taken along the A—A' line of FIG. 1, and FIG. 2(b) is an equivalent circuit diagram thereof. In the drawings, the reference (1) designates a P type semiconductor substrate; (2) designates a low resistant P type semiconductor region which is selectively formed on one main surface of the P type semiconductor substrate (1) to separate an electrical connection between MISFET; (3) and (4) respectively designate N type semiconductor region for m th and m+1 th bit lines (5) designates a first layer of polycrystalline silicon for one electrode of MIS capacitors (n) and (n+1) (FIG. 2(b)); (6) designates a second layer of polycrystalline silicon for switching transistors (l) and (l+1) (FIG. 2(b)); (7) designates a contact hole for electrical connection between the second layer of polycrystalline silicon and an aluminum wire (8) as a word line; and (9) designates an oxide layer.

The operation of the conventional semiconductor memory device having said structure will be illustrated. The m th bit string will be especially illustrated.

When the aluminum wire (8) as the word line is at a high potential, the switching transistors (l) and (l+1) are in the ON state. In this case, if the m th bit line is at a high potential, high potential charge is charged in the MIS capacitor (n) whereas if it is at a low potential, a low potential charge is charged. In this case, the first layer of polycrystalline silicon (5) serving as one of the electrode MIS capacitor (n) is biased at the highest potential for the memory device. Then, if the potential of the aluminum wire (8) serving as the word line is reduced to a low potential, preferably zero volt, the switching transistor (l) is changed in the OFF state to memorize the potential charged to the MIS capacitor (n). This results in write-in and storage of the data for memory.

The read-out of the data will be carried out as follows.

When the aluminum wire (8) as the word line is changed to a high potential, the following potential change is given in the m th bit line.

$$\Delta V = V - V_p = \frac{V_s - V_p}{1 + C_b/C_s} \quad (1)$$

wherein Cs designates the capacity of the MIS capacitor (n); Cb designates the capacity of the m th bit line Vs designates the memorized potential; and Vp designates an original potential of the bit line and V designates a changed potential of the bit line; and $\Delta V$ designates a difference of potentials from the potential Vp. If Vs=0V in the memory condition of the data, the following equation is given:

$$\Delta V_0 = V - V_p = -V_p/1 + \frac{cb}{Cs} \quad (2)$$

If Vs=Vcc, the following equation is given:

$$\Delta V_1 = V - V_p = V_{cc} - V_p/1 - \frac{C_b}{C_s} \quad (3)$$

wherein Vcc designates a high potential, as Vcc>>Vp.

The read-out potential difference from Vs=0 and Vcc is given by the equation:

$$\Delta V_1 - \Delta V_0 = \frac{V_{cc} - V_p}{1 + C_b/C_s} - \left( -\frac{V_p}{1 + C_b/C_s} \right) = \frac{V_{cc}}{1 + C_b/C_s} \quad (4)$$

The value is the read-out signal to discriminate "1" or "0" for the data. The fine potential such as $\Delta V_1 - \Delta V_0 = 0.25V$ in the event that Vcc=5V and Cb/Cs=19 is amplified by an amplifier connected to the bit line and the data are taken out of the semiconductor memory device.

Thus the conventional semiconductor memory device has the following disadvantages.

(A) The bit line capacity (Cb) formed by connection of the N type semiconductor, the substrate and is usually large whereby Cb/Cs is large resulting in a small read-out potential difference given by the equation (4).

(B) The bit line is made of PN junction. For example, if α-rays from the package are applied to the bit line, electrons generated are stored in the bit line to vary the potential of the bit line to cause an erroneous operation.

(C) The gate length of the switching transistors (l) or (l+1) is different depending upon production tolerances.

SUMMARY OF THE INVENTION

It is an object of the present invention to provide a semiconductor memory device which has a small capacity bit line, a large read-out potential difference, a small storage of electrons generated by the α-rays and no erroneous operation.

The foregoing and other objects of the present invention have been attained by providing a semiconductor memory device having two layers of polycrystalline silicon and having an insulated gate field effect transistor as a fundamental element wherein a first layer polycrystalline silicon is used for an electrode of a capacitor and a bit line; and a second layer of polycrystalline silicon is used for a gate electrode of the transistor.

DETAILED DESCRIPTION OF THE PREFERRED EMBODIMENTS

In the present invention, the first layer polycrystalline silicon is used for an electrode of the capacitor and a bit line and the second layer polycrystalline silicon is used for a gate electrode of an insulated gate field effect transistor.

The embodiments of the present invention will be illustrated in detail.

Figure 3:
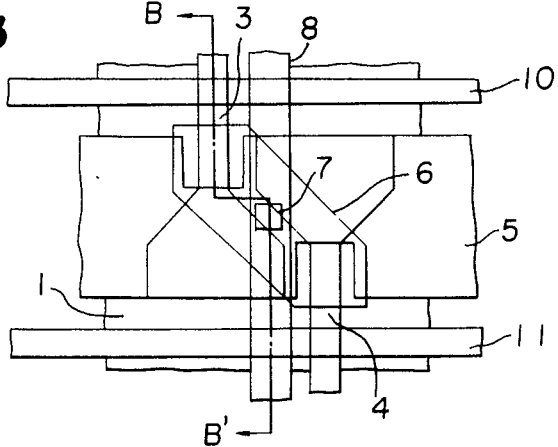
FIG. 3 is a plane view of one embodiment of a semiconductor memory device according to the present invention.
Figure 4A:
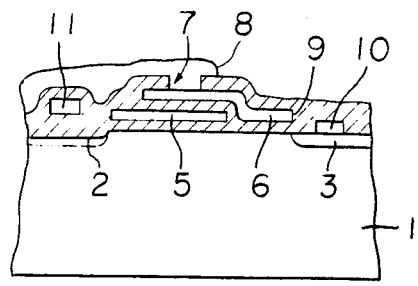
FIGS. 4(a) and 4(b) are respectively a sectional view taken along the B—B' line of FIG. 3 and an equivalent circuit diagram of the memory device thereof.
Figure 4B:
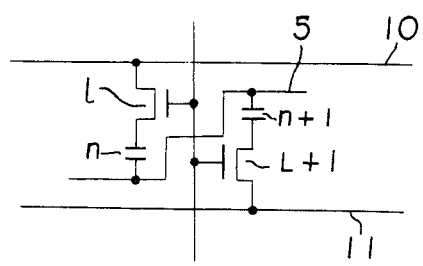

FIG. 3 is a plane view of one embodiment of a semiconductor memory device of the present invention; and FIG. 4(a) is a sectional view taken along the B—B' line of FIG. 3 and FIG. 4(b) is an equivalent circuit diagram of the memory device thereof.

In FIGS. 3 and 4, the reference (10) designates a first layer of polycrystalline silicon which is electrically connected to the N type semiconductor region (3) to form the m th bit line; (11) designates a first layer of polycrystalline silicon which is electrically connected to the N type semiconductor region (4) to form the m+1 th bit line. Thus, the electrical connection between the N type semiconductor region (3) and the m th bit line of the first layer of polycrystalline silicon and the electrical connection between the N type semiconductor region (4) and the m+1 th bit line of the first layer of polycrystalline silicon are respectively direct connections without using an aluminum wire. The N type semiconductor region (4) is placed in only the region for the electrical connection to the first layer of polycrystalline silicon. As shown in FIG. 4(a), most of the region is covered by the oxide layer (9).

Figure 1:
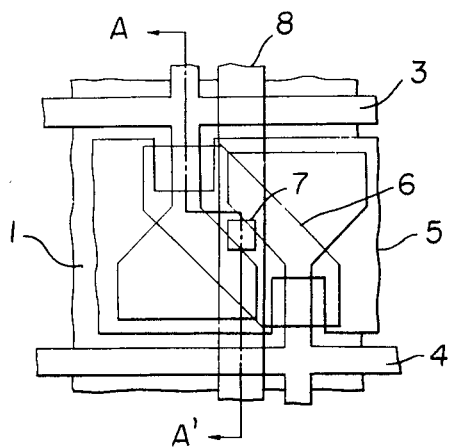
FIG. 1 is a plane view of a conventional semiconductor memory device.
Figure 2A:
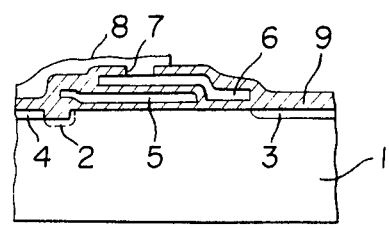
FIGS. 2(a) and 2(b) are respectively a sectional view taken along the A—A' line of FIG. 1 and an equivalent circuit diagram of the memory device thereof.
Figure 2B:
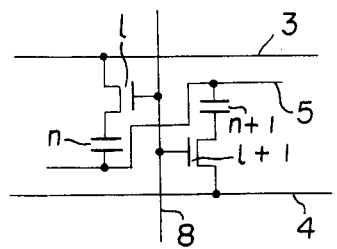

The operation of the semiconductor memory device having the above described structure is the same as that of FIG. 1. In this case, it provides $C_{B2} < C_{B1}$ wherein $C_{B1}$ designates a capacity of a bit line shown in FIG. 1 and $C_{B2}$ designates a capacity of a bit line shown in FIG. 3. Thus, it provides $C_{S2} \approx C_{S1}$ wherein $C_{S1}$ designates a capacity of MIS capacitors n and n+1 shown in FIG. 1 and $C_{S2}$ designates a capacitor of MIS capacitors n+, n+1 shown in FIG. 3. Therefore, the capacity of the bit line is reduced and large read-out potential difference is given to be easily amplified.

The part for the bit line is a quite small part of the N type semiconductor and a most of the residual area is made of the first layer of polycrystalline silicon on the oxide layer whereby the collection of electrons generated by α-rays is reduced so that erroneous operation is not easily caused.

Figure 5A:
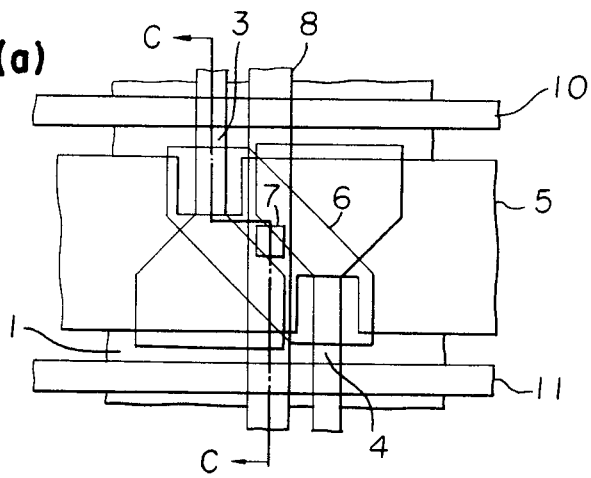
FIGS. 5(a) and 5(b) are respectively a plane view of another embodiment of the semiconductor memory device according to the present invention and a sectional view taken along the C—C' line thereof.
Figure 5B:
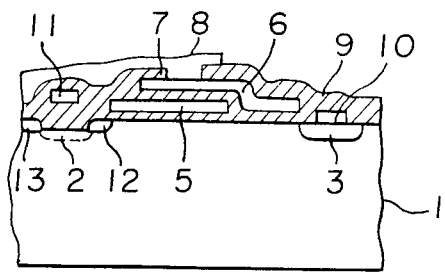

FIGS. 5(a) and 5(b) are respectively a plane view of an other embodiment of the semiconductor memory device of the present invention and a sectional view taken along the C—C' line thereof. In FIGS. 5, the references (12) and (13) respectively designate N region added junction capacitors which are connected to expand the region for the memory capacity ($C_{S2}$) beyond the region shown in FIG. 4. Thus, the junction capacity between the N+ region and the P type semiconductor substrate can be added in parallel to the MIS capacitors (m) and (m+1) to increase the memory capacity ($C_{S2}$).

Thus, the distance between the first layer of polycrystalline silicon (5) and the first layer polycrystal silicon for the m th bit line or the first layer polycrystal silicon for the m+1 th bit line (11) can not by reduced less than a constant distance given depending upon the condition of preparation.

Figure 6:
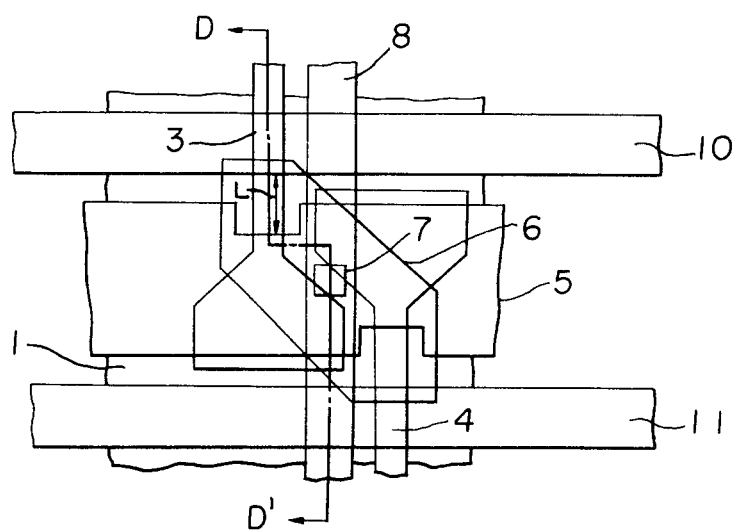
FIGS. 6(a) and 6(b) are respectively a plane view of the other embodiment of the semiconductor memory device according to the present invention and a sectional view taken along the D—D' line thereof.
Figure 6:
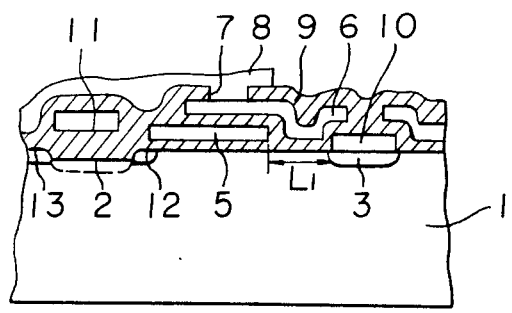

FIGS. 6(a) and 6(b) are respectively a plane view of an other embodiment of the semiconductor memory device of the present invention and a sectional view taken along the D—D' line thereof.

In this case, the second layer of polycrystalline silicon used for the switching transistors (l) and (l+1) partially covers the first layer of polycrystalline silicon (10) used for the m th bit line or the first layer of polycrystalline silicon for the m+1 th bit line whereby the gate lengths can be always kept constant even though the gate lengths (L) of the switching transistor are not uniform. Thus, the gate lengths of the switching transistors can be always kept constant regardless of nonuniformity preparation (especially caused by a deviation of superposition of a mask) whereby any deterioration of characteristics of the switching transistor caused by nonuniformity of the gate lengths (fluctuation of barrier voltages; fluctuation of withstand voltages; and fluctuation of foot current) is not found to give unstable characteristics.

The operation of this embodiment is the same as those of FIGS. 1, 3 and 5.

As described above, in accordance with the semiconductor memory device according to the present invention, the capacity of the bit line ($C_{B2}$) is smaller than the capacity of the conventional bit line ($C_{B1}$) whereby the large read-out potential different shown in the equation (4) is given to be easily amplified. The part for the bit line is a remarkably small part of the N type semiconductor and a most of the residual area is made of the first layer polycrystal silicon formed on the oxide layer whereby the collection of electrons generated by α-rays is reduced such that erroneous operation is not easily caused.

We claim:

1. In a semiconductor memory device having at least two layers of polycrystalline silicon and having an insulated gate field effect transistor as a fundamental element formed on a substrate, an improvement comprising:

a first layer of polycrystalline silicon serving as an electrode of a capacitor including an electric charge storage region, and a bit line, said first polycrystalline silicon layer extending over only a portion of said electric charge storage region, said electric charge storage region including a region not covered by said first polycrystalline layer, said not covered region formed in said substrate and having a conductivity type opposite that of said substrate and acting as an additive junction capacitor to increase the charge storage capacity of said charge storage region; and a second layer of polycrystalline silicon serving as a gate electrode of said transistor, said second layer of polycrystalline silicon partially covering said first layer of polycrystalline silicon and also not covering said additive junction capacitor; and said first and second polycrystalline silicon layers extending over and covering regions of said substrate which are all only of the substrate conductivity type.

2. The semiconductor memory device according to claim 1 wherein said first layer of polycrystalline silicon forms said bit line by being electrically connecting to an N type semiconductor region and the electrical connection thereof is a direct connection.

3. The semiconductor device according to claim 1, wherein said region not covered by said first polycrystalline layer comprises a N region serving as said additive junction capacitor.

* * * * *